US008471246B2

(12) United States Patent
Suzuki et al.

(10) Patent No.: US 8,471,246 B2
(45) Date of Patent: Jun. 25, 2013

(54) PHOTOELECTRIC CONVERSION DEVICE AND IMAGING DEVICE

(75) Inventors: Hideyuki Suzuki, Kanagawa (JP); Tetsuro Mitsui, Kanagawa (JP); Diago Sawaki, Kanagawa (JP); Mitsumasa Hamano, Kanagawa (JP); Masayuki Hayashi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 298 days.

(21) Appl. No.: 12/579,033

(22) Filed: Oct. 14, 2009

(65) Prior Publication Data

US 2010/0089452 A1  Apr. 15, 2010

(30) Foreign Application Priority Data

Oct. 15, 2008 (JP) ................................. 2008-266292
Jan. 6, 2009 (JP) ................................. 2009-001087

(51) Int. Cl.
*H01L 29/12* (2006.01)
*H01L 29/861* (2006.01)

(52) U.S. Cl.
USPC ...................... 257/40; 257/E51.028; 136/263

(58) Field of Classification Search
None
See application file for complete search history.

(56) References Cited

U.S. PATENT DOCUMENTS

| 6,580,027 | B2 * | 6/2003 | Forrest et al. ................. 136/263 |
| 7,566,943 | B2 * | 7/2009 | Yokoyama ..................... 257/448 |
| 7,750,423 | B2 * | 7/2010 | Yokoyama ..................... 257/431 |
| 7,803,468 | B2 * | 9/2010 | Nariyuki et al. ............... 428/690 |
| 7,943,245 | B2 * | 5/2011 | Tobise ........................... 428/690 |
| 7,999,339 | B2 * | 8/2011 | Yokoyama ..................... 257/431 |
| 8,217,260 | B2 * | 7/2012 | Laird et al. .................... 136/263 |
| 2002/0149010 | A1 * | 10/2002 | Wakimoto et al. ............. 257/40 |
| 2005/0205903 | A1 * | 9/2005 | Hioki ............................. 257/291 |
| 2005/0217722 | A1 * | 10/2005 | Komatsu et al. ............... 136/263 |
| 2005/0263183 | A1 * | 12/2005 | Nishikitani et al. ........... 136/263 |
| 2006/0054987 | A1 * | 3/2006 | Nii ................................ 257/440 |
| 2006/0068223 | A1 * | 3/2006 | Nariyuki et al. ............... 428/690 |

(Continued)

FOREIGN PATENT DOCUMENTS

| JP | 2006261172 A | 9/2006 |
| JP | 2007-088033 A | 4/2007 |

(Continued)

OTHER PUBLICATIONS

Szuber, J., B. Szczepaniak, M. Piwowarczyk, S. Kochowski, and A. Opilski. "Electronic Properties of the Space Charge Layer of the Copper Phthalocyanine Thin Films." Czechoslovak Journal of Physics 43.9-10 (1993): 1041-044.*

(Continued)

*Primary Examiner* — Thomas L Dickey
*Assistant Examiner* — Joseph Schoenholtz
(74) *Attorney, Agent, or Firm* — Sughrue Mion, PLLC

(57) ABSTRACT

A photoelectric conversion device is provided, the photoelectric conversion device including: a pair of electrodes; a photoelectric conversion layer arranged between the pair of electrodes and containing an n-type organic semiconductor; and a charge blocking layer arranged between one of the pair of electrodes and the photoelectric conversion layer, the charge blocking layer being formed of a single layer or two or more layers, wherein a difference $\Delta 1$ between ionization potential Ip of a layer of the charge blocking layer adjacent to the photoelectric conversion layer and electron affinity Ea of the n-type organic semiconductor is at least 1 eV; and the charge blocking layer has a gross thickness of at least 20 nm.

6 Claims, 4 Drawing Sheets

U.S. PATENT DOCUMENTS

| | | | |
|---|---|---|---|
| 2006/0175582 A1* | 8/2006 | Hammond et al. | 252/500 |
| 2006/0278944 A1* | 12/2006 | Rand et al. | 257/431 |
| 2007/0082140 A1* | 4/2007 | Suzuki et al. | 427/402 |
| 2007/0205477 A1* | 9/2007 | Yokoyama | 257/429 |
| 2008/0246107 A1* | 10/2008 | Maehara | 257/432 |
| 2009/0189058 A1* | 7/2009 | Mitsui et al. | 250/208.1 |

FOREIGN PATENT DOCUMENTS

| | | |
|---|---|---|
| JP | 2007-123707 A | 5/2007 |
| JP | 2008-072090 A | 3/2008 |
| JP | 2009200482 A | 9/2009 |

OTHER PUBLICATIONS

Yu, Gang, Jian Wang, Jon McElvain, and Alan J. Heeger. "Large-Area, Full-Color Image Sensors Made with Semiconducting Polymers." Advanced Materials 10.17 (1998): 1431-1434.*

Danovich, David. "Ionization Potentials and Electron Affinities of Fullerenes, an OVGF Approach." 210th ACS National Meeting. Chicago. Aug. 21, 1995.*

Wu, Hongbin, and Lai-Sheng Wang. "A Study of Nickel Monoxide (NiO), Nickel Dioxide (ONiO), and Ni(O[sub 2]) Complex by Anion Photoelectron Spectroscopy." The Journal of Chemical Physics 107.1 (1997): 16.*

Lin, Chi-Feng. "High Photoelectric Conversion Efficiency of Metal Phthalocyanine/Fullerene Heterojunction Photovoltaic Device." International Journal of Molecular Sciences 12 (2011): 476-505.*

Luo, Ji. "Positive Electron Affinity of Fullerenes: Its Effect and Origin." J. Chem. Phys. 120 (2004): 7998-8001.*

Park, Y., V. Choong, Y. Gao, B. R. Hsieh, and C. W. Tang. "Work Function of Indium Tin Oxide Transparent Conductor Measured by Photoelectron Spectroscopy." Applied Physics Letters 68.19 (1996): 2699.*

Illescas, B., and N. Martin. Fullerene-Based Electron Acceptors—Handboodk of Nanophysics. Boca Raton: Taylor and Francis, 2011.*

Odobel, Fabrice, Loïc Le Pleux, Yann Pellegrin, and Errol Blart. "New Photovoltaic Devices Based on the Sensitization of P-type Semiconductors: Challenges and Opportunities." Accounts of Chemical Research 43.8 (2010): 1063-071.*

He, Jianjun, Henrik Lindström, Anders Hagfeldt, and Sten-Eric Lindquist. "Dye-Sensitized Nanostructured P-Type Nickel Oxide Film as a Photocathode for a Solar Cell." The Journal of Physical Chemistry B 103.42 (1999): 8940-943.*

Berkowitz, J., C. H. Batson, and G. L. Goodman. "PES of Higher Temperature Vapors: Lithium Halide Monomers and Dimers." The Journal of Chemical Physics 71.6 (1979): 2624.*

Ionization Energy and Electron Affinity, Purdue retrieved from URL <http://chemed.chem.purdue.edu/genchem/topicreview/bp/ch7/ie_ea.html#ea> on Oct. 11, 2012.*

Hoke, Eric. "The Role of Electron Affinity in Determining Whether Fullerenes Catalyze or Inhibit Photo-oxidation of Polymers for Solar Cells." Adv. Energy Mater. (2012): 1-7.*

Diener, Michael D. "Improved Fullerenes for OPV." Solar Energy Technologies Program Peer Review. May 26, 2010.*

Wang, Lai-Sheng, J. Conceicao, Changming Jin, and R.E. Smalley. "Threshold Photodetachment of Cold C-60." Chemical Physics Letters 182.1 (1991): 5-11.*

Saito, G., T. Teramoto, A. Otsuka, Y. Sugita, T. Ban, M. Kusunoki, and K. Sakaguchi. "Preparation and Ionicity of C60 Charge Transfer Complexes." Synthetic Metals 64.2-3 (1994): 359-68.*

Voz, C., J. Puigdollers, S. Cheylan, M. Fonrodona, M. Stella, J. Andreu, and R. Alcubilla. "Photodiodes Based on Fullerene Semiconductor." Thin Solid Films 515.19 (2007): 7675-678.*

* cited by examiner

- 14: UPPER ELECTRODE
- 18: SECOND BLOCKING LAYER
- 16: FIRST BLOCKING LAYER
- 15: CHARGE BLOCKING LAYER
- 12: PHOTOELECTRIC CONVERSION LAYER
- 11: LOWER ELECTRODE

LOWER ELECTRODE, PHOTOELECTRIC CONVERSION LAYER, FIRST BLOCKING LAYER, SECOND BLOCKING LAYER, UPPER ELECTRODE

PHOTOELECTRIC CONVERSION DEVICE AND IMAGING DEVICE

BACKGROUND OF THE INVENTION

1. Field of the Invention

The present invention relates to a photoelectric conversion device and an imaging device.

2. Description of the Related Art

Photoelectric conversion devices that have so far been put forth include those disclosed in the following documents.

The organic photoelectric conversion device disclosed in JP-A-2007-88033 is an organic photoelectric conversion device that has an organic photoelectric conversion layer between one pair of electrodes, wherein a charge blocking layer having the function of inhibiting charge injection from one of the electrodes is provided between the electrode and the organic photoelectric conversion layer, and besides, the ionization potential and electron affinity of the charge blocking layer are in their respective magnitude ranges specified in relation to the adjoining electrode and organic photoelectric conversion layer.

The organic photoelectric conversion device disclosed in JP-A-2008-72090 is an organic photoelectric conversion device that has an organic photoelectric conversion layer between one pair of electrodes, wherein two or more charge blocking layers are provided between the organic photoelectric conversion layer and the electrodes.

Where relations between the photoelectric conversion layer and the charge blocking layers are concerned, in order that carriers generated in the organic photoelectric conversion layer are extracted without impairment, the positive hole blocking layer or layers are adjusted to have electron affinity Ea greater than the Ea of the photoelectric conversion layer, while the electron blocking layer or layers are adjusted to have ionization potential Ip smaller than the Ip of the photoelectric conversion layer.

And JP-A-2007-123707 relates to the imaging device that incorporates a photoelectric conversion device having a structure that photoelectric conversion element including a p-type semiconductor and an n-type semiconductor is sandwiched between a pair of electrodes, wherein the photoelectric conversion element contains a fullerene or a fullerene derivative. For the purpose of enhancing the photoelectric conversion efficiency, such an imaging device can also be structured to have between the p-type semiconductor and the n-type semiconductor a bulk heterojunction structural layer containing both the p-type semiconductor and the n-type semiconductor as an intermediate layer.

SUMMARY OF THE INVENTION

Although the use of an n-type organic material having a high carrier-transporting capability in a photoelectric conversion layer or the use of a bulk heterojunction structure as in JP-A-2007-123707 is effective in achieving high photoelectric conversion efficiency, these cases still have room for improvement in the sense that the dark current cannot be reduced only by the methods of JP-A-2007-88033 and JP-A-2008-72090.

As a result of our analysis, Inventors have supposed that the following points are concerned in factors for an issue of carriers:
(i) Relationship between Ea of an organic semiconductor incorporated in a photoelectric conversion layer and Ip of a charge blocking layer
(ii) Total thickness of charge blocking layers The invention has been made in view of these circumstances, and an object thereof is to provide a photoelectric conversion device and an imaging device which each can ensure reduction in dark current by inhibiting an issue of carriers.

The present invention is described below.

(1) A photoelectric conversion device, including:
a pair of electrodes;
a photoelectric conversion layer that is arranged between the pair of electrodes and that contains an n-type organic semiconductor; and
a charge blocking layer that is arranged between at least one of the pair of electrodes and the photoelectric conversion layer, the charge blocking layer being formed of a single layer or two or more layers,
wherein
(a) a difference $\Delta 1$ between ionization potential Ip of a layer of the charge blocking layer adjacent to the photoelectric conversion layer and electron affinity Ea of the n-type organic semiconductor is at least 1 eV; and
(b) the charge blocking layer has a gross thickness of at least 20 nm.

(2) The photoelectric conversion device as described in item (1) above,
wherein the charge blocking layer includes two or more layers, and
a layer of the charge blocking layer adjacent to the photoelectric conversion layer out of the two or more layers has a thickness of at least 10 nm.

(3) The photoelectric conversion device as described in item (1) or (2) above,
wherein the photoelectric conversion layer further contains a p-type organic semiconductor.

(4) The photoelectric conversion device as described in any of items (1) to (3) above,
wherein the charge blocking layer comprises two or more layers, and
a difference between electron affinity Ea of a layer of the charge blocking layer adjacent to one of the pair of electrode out of the two or more layers and a work function of the adjacent one of the pair of electrodes is at least 1.3 eV.

(5) The photoelectric conversion device as described in any of items (1) to (4) above,
wherein the n-type organic semiconductor contains a fullerene or a fullerene derivative.

(6) The photoelectric conversion device as described in any of items (3) to (5) above,
wherein the charge blocking layer includes two or more layers, and
a layer of the charge blocking layer adjacent to the photoelectric conversion layer out of the two or more layers includes the same material as the p-type organic semiconductor contained in the photoelectric conversion layer.

(7) The photoelectric conversion device as described in any of items (1) to (6) above,
wherein the charge blocking layer has at least one layer containing an inorganic material.

(8) An imaging device, including:
the photoelectric conversion device as described in any of items (1) to (7) above;
a substrate over which the photoelectric conversion device is formed; and
a signal readout section that reads of charges generated by the photoelectric conversion device.

BRIEF DESCRIPTION OF THE DRAWINGS

The features of the invention will appear more fully upon consideration of the exemplary embodiments of the inventions, which are schematically set forth in the drawings, in which.

DETAILED DESCRIPTION OF THE INVENTION

Illustrative embodiments of the invention are described below in detail on the basis of the drawings.

Figure 1:
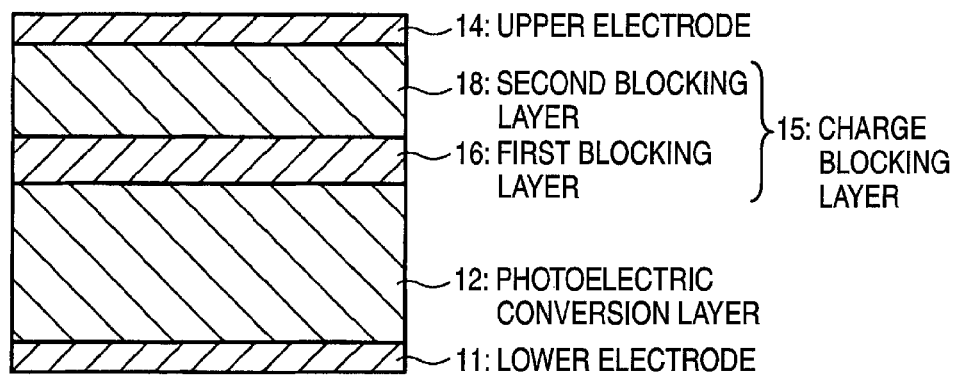
FIG. 1 is a cross-sectional view showing a layer structure of a photoelectric conversion device.

FIG. 1 is a cross-sectional view that shows a layer structure of a photoelectric conversion device for illustration of an embodiment of the invention.

The photoelectric conversion device includes a lower electrode 11 and an upper electrode 14 provided in the upward position so as to face the lower electrode 11. In addition, a photoelectric conversion layer 12 and a charge blocking layer 15 are provided between the lower electrode 11 and the upper electrode 14. The lower surface of the photoelectric conversion layer 12 is adjacent to the lower electrode 11, and the upper face thereof is adjacent to the charge blocking layer 15. The upper surface of the charge blocking layer 15 is adjacent to the upper electrode 14. At least either the lower electrode 11 or the upper electrode 14 is transparent conductive element.

The charge blocking layer 15 has the function of reducing a dark current, and it is made up of a first blocking layer 16 and a second blocking layer 18. By allowing the charge blocking layer to have a multilayer structure, an interface is formed between the first blocking layer 16 and the second blocking layer 18 to result in appearance of discontinuity between intermediate levels present in individual layers. So, it becomes difficult for carriers to travel through the intermediate levels, and dark current reduction becomes possible. Alternatively, as in another structural example described hereafter, the charge blocking layer 15 may have a single-layer structure.

The photoelectric conversion layer 12 is formed with thin element of a mixture of p-type and n-type organic semiconductors. However, it is also possible for the photoelectric conversion layer 12 to have a composition containing at least one n-type organic semiconductor.

The p-type organic semiconductors (compounds) are organic semiconductors (compounds) having donor properties, mainly typified by organic compounds capable of transporting positive holes, and refer to organic compounds having a tendency to donate electrons. More specifically, when two organic materials are used in a mutually contact condition, one organic material that has smaller ionization potential than the other is referred to as a p-type organic compound. Accordingly, any organic compounds can be used as organic compounds having donor properties so long as they have the property of donating electrons. Examples of such organic compounds include triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, condensed aromatic carbon ring compounds (such as naphthalene derivatives, anthracene derivatives, phenanthrene derivatives, tetracene derivatives, pyrene derivatives, perylene derivatives and fluoranthene derivatives), and metal complexes containing nitrogen-containing heterocyclic compounds as ligands. Additionally, the organic compounds having donor properties are not limited to the compounds recited above but, as mentioned above, any other organic compounds having smaller ionization potential than the organic compounds used as n-type (acceptant) compounds may be also used as organic semiconductors having donor properties.

The n-type organic semiconductors (compounds) are organic semiconductors (compounds) having acceptor properties, mainly typified by organic compounds having the property of transporting electrons, and refer to organic compounds having a tendency to accept electrons. More specifically, when two organic compounds are used in a mutually contact condition, one organic compound that has greater electron affinity than the other is referred to as an n-type organic compound. Accordingly, any organic compounds can be used as organic compounds having acceptor properties so long as they have the property of accepting electrons. Examples of such organic compounds include condensed aromatic carbon ring compounds (such as naphthalene derivatives, anthracene derivatives, phenanthrene derivatives, tetracene derivatives, pyrene derivatives, perylene derivatives and fluoranthene derivatives), nitrogen-, oxygen- or/and sulfur-containing 5- to 7-membered heterocyclic compounds (such as pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, bezoxazole, benzothiazole, carbazole, purine, triazolopyridazine, triazolopyrimidine, tetrazaindene, oxadiazole, imidazopyridine, pyrazolidine, pyrrolopyridine, thiadiazolopyridine, dibenzazepine and tribenzazepine), polyarylene compounds, fluorene compounds, cyclopentadiene compounds, silyl compounds, and metal complexes containing nitrogen-containing heterocyclic compounds as ligands. Additionally, the organic compounds having acceptor properties are not limited to the compounds recited above but, as mentioned above, any other organic compounds having greater electron affinity than the organic compounds used as compounds having donor properties may be also used as organic semiconductors having acceptor properties.

As p-type organic dyes or n-type organic dyes, any dyes may be used. Suitable examples of such dyes include cyanine dyes, styryl dyes, hemicyanine dyes, merocyanine dyes (including zero-methine merocyanine (simple merocyanine)), trinuclear merocyanine dyes, tetranuclear merocyanine dyes, rhodacyanine dyes, complex cyanine dyes, complex merocyanine dyes, allopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, spiro compounds, metallocene dyes, fluorenone dyes, fulgide dyes, perylene dyes, perinone dyes, phenazine dyes, phenothiazine dyes, quinone dyes, diphenylmethane dyes, polyene dyes, acridine dyes, acridinone dyes, diphenylamine dyes, quinacridone dyes, quinophthalone dyes, phenoxazine dyes, phthaloperylene dyes, diketopyrrolopyrrole dyes, dioxane dyes, porphyrin dyes, chlorophyll dyes, phthalocyanine dyes, metal cocmplex dyes, and condensed aromatic carbon-ring dyes (such as naphthalene derivatives, anthracene derivatives, phenanthrene derivatives, tetracene derivatives, pyrene derivatives, perylene derivatives and fluoranthene derivatives).

In the first blocking layer 16 and the second blocking layer 18, electron-donating organic materials can be used. Examples of a low molecular-weight compound usable as such a material include aromatic diamine compounds such as N,N'-bis(3-methylphenyl)-(1,1'-biphenyl)-4,4'-diamine (TPD) and 4,4'-bis[N-(naphthyl)-N-phenyl-amino]biphenyl (α-NPD), oxazole, oxadiazole, triazole, imidazole, imidazolone, stilbene derivatives, pyrazoline derivatives, tetrahydroimidazole, polyarylalkane, butadiene, 4,4',4"-tris(N-(3-methylphenyl)N-phenylamino)triphenylamine (m-MTDATA), porphyrin compounds such as porphine, tetraphenylporphine copper, phthalocyanine, copper phthalocyanine and titanium phthalocyanine oxide, triazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, oxazole derivatives, styrylanthracene derivatives, fluorenone derivatives, hydrazone derivatives, and silazane derivatives. Examples of a high molecular-weight compound usable as the electron-donating organic material include polymers such as phenylenevinylene polymers, fluorene polymers, carbazole polymers, indole polymers, pyrene polymers, pyrrole polymers, picoline polymers, thiophene polymers, acetylene polymers and diacetylene polymers, and derivatives of these polymers. And it is also possible to use compounds which are not included in electron-donating compounds so long as they are compounds having sufficient capability of transporting positive holes.

It is also possible to use an inorganic material in the charge blocking layer 15. Since an inorganic material is generally greater in dielectric constant than an organic material, its use in the charge blocking layer 15 allows application of a large voltage to the photoelectric conversion layer 12, which contributes to enhancement of photoelectric conversion efficiency. Examples of a material which can be formed into the charge blocking layer 15 include NiO, CaO, $MoO_3$, IrO, $MnO_2$, $Nb_2O_5$, CoO, $Cr_2O_3$, $Cu_2O_3$, CuO, $Bi_2O_3$, $CuGaO_2$, $CuCrO_2$, $CuInO_2$, $AgInO_2$ and $SrCu_2O_2$.

In the charge blocking layer 15 having two or more constituent layers, the constituent layer adjacent to the photoelectric conversion layer 12 is preferably a layer formed from the same material as the p-type organic semiconductor incorporated in the photoelectric conversion layer 12. In this way, the use of the same p-type organic semiconductor in the charge blocking layer also inhibits an intermediate level from forming at the interface between the photoelectric conversion layer 12 and the layer adjacent thereto, and thereby a dark current can be further reduced.

When the charge blocking layer 15 is a single layer, the layer can be a layer formed from an inorganic material. In the case of a multiple layer, on the other hand, only one or more than one layer can be a layer formed from an inorganic material.

As the n-type organic semiconductors, fullerenes or fullerene derivatives are preferably used.

The term fullerenes is intended to include fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, mixed fullerenes and fullerene nanotubes, and the term fullerene derivatives refers to the compounds prepared by attaching substituents to those fullerenes.

Designation of a specific portion as "group" in the invention, even if the portion in itself is not explicitly substituted, implies that the portion may have one or more (up to the greatest possible number of) substituents. For instance, the term "an alkyl group" is intended to include substituted and unsubstituted alkyl groups. The substituents which can be attached to compounds used in the invention may be any kinds of substituents.

When such substituents are symbolized by W, those which are represented by W may be any substituents and have no particular restriction. Examples of W include a halogen atom, an alkyl group (including a cycloalkyl group, a bicycloalkyl group and a tricycloalkyl group), an alkenyl group (including a cycloalkenyl group and a bicycloalkenyl group), an alkynyl group, an aryl group, a heterocyclic group (which may be referred to as a hetero-ring group), a cyano group, a hydroxyl group, a nitro group, a carboxyl group, an alkoxy group, an aryloxy group, a silyloxy group, a heterocyclyloxy group, an acyloxy group, a carbamoyloxy group, an alkoxycarbonyloxy group, an aryloxycarbonyloxy group, an amino group (including an aniline group), an ammonio group, an acylamino group, an aminocarbonylamino group, an alkoxycarbonylamino group, an aryloxycarbonylamino group, a sulfamoylamino group, alkyl- and arylsulfonylamino groups, a mercapto group, an alkylthio group, an arylthio group, a heterocyclylthio group, a sulfamoyl group, a sulfo group, alkyl- and arylsulfinyl groups, alkyl- and arylsulfonyl groups, an acyl group, an aryloxycarbonyl group, an alkoxycarbonyl group, a carbamoyl group, aryl- and heterocyclylazo groups, an imido group, a phosphino group, a phosphinyl group, a phosphinyloxy group, a phosphinylamino group, a phosphono group, a silyl group, a hydrazino group, an ureido group, a boronic acid residue (—$B(OH)_2$), a phosphate group (—$OPO(OH)_2$), a sulfato group (—$OSO_3H$), and other known substituents.

More specifically, W represents a halogen atom (such as a fluorine atom, a chlorine atom, a bromine atom and an iodine atom), an alkyl group [which represents a linear, branched or cyclic, substituted or unsubstituted alkyl group, with examples including alkyl groups (preferably alkyl groups having 1 to 30 carbon atoms, such as methyl, ethyl, n-propyl, isopropyl, t-butyl, n-octyl, eicosyl, 2-chloroethyl, 2-cyanoethyl and 2-ethylhexyl), cycloalkyl groups (preferably substituted or unsubstituted cycloalkyl groups having 3 to 30 carbon atoms, such as cyclohexyl, cyclopentyl and 4-n-dodecylcyclohexyl), bicycloalkyl groups (preferably substituted or unsubstituted bicycloalkyl groups having 5 to 30 carbon atoms, namely univalent groups formed by taking away one hydrogen atom from each of bicycloalkanes having 5 to 30 carbon atoms, such as bicyclo[1.2.2]heptane-2-yl and bicyclo[2.2.2]octane-3-yl), and alkyl groups having polycyclic structures including a tricyclic structure; incidentally, it is intended that the alkyl moieties in substituents as recited below (e.g. the alkyl moiety in an alkylthio group) represent the alkyl groups following the concept defined above, and further include alkenyl groups and alkynyl groups], an alkenyl group [which represents a linear, branched or cyclic, substituted or unsubstituted alkenyl group, with examples including alkenyl groups (preferably substituted or unsubstituted alkenyl groups having 2 to 30 carbon atoms, such as vinyl, allyl, prenyl, geranyl and oleyl), cycloalkenyl groups (preferably substituted or unsubstituted cycloalkenyl groups having 3 to 30 carbon atoms, namely univalent groups formed by taking away one hydrogen atom from each of cycloalkenes having 3 to 30 carbon atoms, such as 2-cyclopentene-1-yl, 2-cyclohexene-1-yl), bicycloalkenyl groups (substituted or unsubstituted bicycloalkenyl groups, preferably those having 5 to 30 carbon atoms, namely univalent groups formed by taking away one hydrogen atom from each of bicycloalkenes having one double bond each, such as bicyclo[2.2.1]hepto-2-ene-1yl and bicyclo[2.2.2]octo-2-ene-4-yl)], an alkynyl group (preferably a substituted or unsubstituted alkynyl group having 2 to 30 carbon atoms, such as an ethynyl group, a propargyl group or a trimethylsilylethynyl group), an aryl group (preferably a substituted or unsubstituted aryl group having 6 to 30 carbon atoms, such as phenyl, p-tolyl, naphthyl, m-chlorophenyl or o-hexadecanoylaminophenyl), a heterocyclic group (preferably a univalent group formed by taking away one hydrogen atom from a 5- or 6-membered, substituted or unsubstituted, aromatic or non-aromatic heterocyclic compound, far preferably a 5- or 6-membered aromatic heterocyclic group having 3 to 30 carbon atoms, such as 2-furyl, 2-thienyl, 2-pyrimidinyl, 2-benzothiazolyl, which may include cationic heterocyclic groups such as 1-methyl-2-pyridinio and 1-methyl-2-quinolinio), a cyano group, a hydroxyl group, a nitro group, a carboxyl group, an alkoxy group (preferably a substituted or unsubstituted alkoxy group having 1 to 30 carbon atoms, such as methoxy, ethoxy, isopropoxy, t-butoxy, n-octyloxy or 2-methoxyethoxy), an aryloxy group (preferably a substituted or unsubstituted aryloxy group having 6 to 30 carbon atoms, such as phenoxy, 2-methylphenoxy, 4-t-butylphenoxy, 3-nitrophenoxy or 2-tetradecanoylaminophenoxy), a silyloxy group (preferably a silyloxy group having 3 to 20 carbon atoms, such as trimethylsilyloxy or t-butyldimethylsilyloxy), a heterocyclyloxy group (preferably a substituted or unsubstituted heterocyclyloxy group having 2 to 30 carbon atoms, such as 1-phenyltetrazole-5-oxy or 2-tetrahydropyranyloxy), an acyloxy group (preferably a formyloxy group, a substituted or unsubstituted alkylcarbonyloxy group having 2 to 30 carbon atoms or a substituted or unsubstituted arylcarbonyloxy group having 6 to 30 carbon atoms, such as formyloxy, acetyloxy, pivaloyloxy, stearoyloxy, benzoyloxy or p-methoxyphenylcarbonyloxy), a carbamoyloxy group (preferably a substituted or unsubstituted carbamoyloxy group having 1 to 30 carbon atoms, such as N,N-dimethylcarbamoyloxy, N,N-diethylcarbamoyloxy, morpholinocarbonyloxy, N,N-di-n-octylaminocarbonyloxy or N-n-octylcarbamoyloxy), an alkoxycarbonyloxy group (preferably a substituted or unsubstituted alkoxycarbonyloxy group having 2 to 30 carbon atoms, such as methoxycarbonyloxy, ethoxycarbonyloxy, t-butoxycarbonyloxy or n-octylcarbonyloxy), an aryloxycarbonyloxy group (preferably a substituted or unsubstituted aryloxycarbonyloxy group having 7 to 30 carbon atoms, such as phenoxycarbonyloxy, p-methoxyphenoxycarbonyloxy or p-n-hexadecyloxyphenoxycarbonyloxy), an amino group (preferably an amino group, a substituted or unsubstituted alkylamino group having 1 to 30 carbon atoms or a substituted or unsubstituted aniline group having 6 to 30 carbon atoms, such as amino, methylamino, dimethylamino, anilino, N-methyl-anilino or diphenylamino), an ammonio group (preferably an ammonio group or an ammonio group substituted with substituted or unsubstituted alkyl, aryl or/and heterocyclyl groups, wherein 1 to 30 carbon atoms are contained, such as trimethylammonio, triethylammonio or diphenylmethylammonio), an acylamino group (preferably a formylamino group, a substituted or unsubstituted alkylcarbonylamino group having 2 to 30 carbon atoms or a substituted or unsubstituted arylcarbonylamino group having 7 to 30 carbon atoms, such as formylamino, acetylamino, pivaloylamino, lauroylamino, benzoylamino or 3,4,5-tri-n-octyloxyphenylcarbonylamino), an aminocarbonylamino group (preferably a substituted or unsubstituted aminocarbonylamino group having 1 to 30 carbon atoms, such as carbamoylamino, N,N-dimethylaminocarbonylamino, N,N-diethylaminocarbonylamino or morpholinocarbonylamino), an alkoxycarbonylamino group (preferably a substituted or unsubstituted alkoxycarbonylamino group having 2 to 30 carbon atoms, such as methoxycarbonylamino, ethoxycarbonylamino, t-butoxycarbonylamino, n-octadecyloxycarbonylamino or N-methyl-methoxycarbonylamino), an aryloxycarbonylamino group (preferably a substituted or unsubstituted aryloxycarbonylamino group having 7 to 30 carbon atoms, such as phenoxycarbonylamino, p-chlorophenoxycarbonylamino or m-n-ocryloxyphenoxycarbonylamino), a sulfamoylamino group (preferably a substituted or unsubstituted sulfamoylamino group having 0 to 30 carbon atoms, such as sulfamoylamino, N,N-dimethylaminosulfonylamino or N-n-octylaminosulfonylamino), alkyl- and arylsulfonylamino groups (preferably a substituted or unsubstituted alkylsulfonylamino group having 1 to 30 carbon atoms and a substituted or unsubstituted arylsulfonylamino group having 6 to 30 carbon atoms, such as methylsulfonylamino, butylsulfonylamino, phenylsulfonylamino, 2,3,5-trichlorophenylsulfonylamino and p-methylphenylsulfonylamino), a mercapto group, an alkylthio group (preferably a substituted or unsubstituted alkylthio group having 1 to 30 carbon atoms, such as methylthio, ethylthio or n-hexadecylthio), an arylthio group (preferably a substituted or unsubstituted arylthio group having 6 to 30 carbon atoms, such as phenylthio, p-chlorophenylthio or m-methoxyphenylthio), a heterocyclylthio group (preferably a substituted or unsubstituted heterocyclylthio group having 2 to 30 carbon atoms, such as 2-benzothiazolylthio or 1-phenyltetrazole-5-ylthio), a sulfamoyl group (preferably a substituted or unsubstituted sulfamoyl group having 0 to 30 carbon atoms, such as N-ethylsulfamoyl, N-(3-dodecyloxypropyl)sulfamoyl, N,N-dimethylsulfamoyl, N-acetylsulfamoyl, N-benzoylsulfamoyl or N-(N'-phenylcarbamoyl)sulfamoyl), a sulfo group, alkyl- and arylsulfinyl groups (preferably a substituted or unsubstituted alkylsulfinyl group having 1 to 30 carbon atoms and a substituted or unsubstituted arylsulfinyl group having 6 to 30 carbon atoms, such as methylsulfinyl, ethylsulfinyl, phenylsulfinyl and p-methylphenylsulfinyl), alkyl- and arylsulfonyl groups (preferably a substituted or unsubstituted alkylsulfonyl group having 1 to 30 carbon atoms and a substituted or unsubstituted arylsulfonyl group having 6 to 30 carbon atoms, such as methylsulfonyl, ethylsulfonyl, phenylsulfonyl and p-methylphenylsulfonyl), an acyl group (preferably a formyl group, a substituted or unsubstituted alkylcarbonyl group having 2 to 30 carbon atoms, a substituted or unsubstituted arylcarbonyl group having 7 to 30 carbon atoms or a substituted or unsubstituted heterocyclylcarbonyl group having 4 to 30 carbon atoms, wherein the carbonyl group is attached to one of the ring carbon atoms, such as acetyl, pivaloyl, 2-chloroacetyl, stearoyl, benzoyl, p-n-octyloxyphenylcarbonyl, 2-pyridylcarbonyl or 2-furylcarbonyl), an aryloxycarbonyl group (preferably a substituted or unsubstituted aryloxycarbonyl group having 7 to 30 carbon atoms, such as phenoxycarbonyl, o-chlorophenoxycarbonyl, m-nitrophenoxycarbonyl or p-t-butylphenoxycarbonyl), an alkoxycarbonyl group (preferably a substituted or unsubstituted alkoxycarbonyl group having 2 to 30 carbon atoms, such as methoxycarbonyl, ethoxycarbonyl, t-butoxycarbonyl or n-octadecyloxycarbonyl), a carbamoyl group (preferably a substituted or unsubstituted carbamoyl group having 1 to 30 carbon atoms, such as carbamoyl, N-methylcarbamoyl, N,N-dimethylcarbamoyl, N,N-di-n-octylcarbamoyl or N-(methylsulfonyl)carbamoyl), aryl- and heterocyclylazo groups (preferably a substituted or unsubstituted arylazo group having 6 to 30 carbon atoms and a substituted or unsubstituted heterocyclylazo group having 3 to 30 carbon atoms, such as phenylazo, p-chlorophenylazo and 5-ethylthio-1,3,4-thiadiazole-2-ylazo), an imido group (preferably N-succinimido or N-phthalimido), a phosphino group (preferably a substituted or unsubstituted phosphino group having 2 to 30 carbon atoms, such as dimethylphosphino, diphenylphosphin or methylphenoxyphosphino), a phosphinyl group (preferably a substituted or unsubstituted phosphinyl group having 2 to 30 carbon atoms, such as phosphinyl, dioctyloxyphosphinyl or diethoxyphosphinyl), a phosphinyloxy group (preferably a substituted or unsubstituted phosphinyloxy group having 2 to 30 carbon atoms, such as diphenoxyphosphinyloxy or dioctyloxyphosphinyloxy), an phosphinylamino group (preferably a substituted or unsubstituted phosphinylamino group having 2 to 30 carbon atoms, such as dimethoxyphosphinylamino or dimethylaminophosphinylamino), a phospho group, a silyl group (preferably a substituted or unsubstituted silyl group having 3 to 30 carbon atoms, such as trimethylsilyl, t-butyldimethylsilyl or phenylsimethylsilyl), a hydrazino group (preferably a substituted or unsubstituted hydrazino group having 0 to 30 carbon atoms, such as trimethylhydrazino), or an ureido group (preferably a substituted or unsubstituted ureido group having 0 to 30 carbon atoms, such as N,N-dimethylureido).

In addition, two Ws can also collaborate on formation of a ring (an aromatic or non-aromatic hydrocarbon ring or a heterocyclic ring, which can further be combined with another ring to form a polycyclic condensed ring, such as a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a benzimidazole ring, an imidazopyridine ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring or a phenazine ring).

As to the hydrogen-containing groups among the substituents recited above as examples of W, the hydrogen atoms therein may be taken away from the groups and replaced with some substituents as recited above. Examples of such a group include a —CONHSO$_2$— group (a sulfonylcarbamoyl group or a carbonylsulfamoyl group), a —CONHCO— group (a carbonylcarbamoyl group) and a —SO$_2$NHSO$_2$— group (a sulfonylsulfamoyl group).

More specifically, those groups include an alkylcarbonylaminosulfonyl group (e.g. acetylaminosulfonyl), an arylcarbonylaminosulfonyl group (e.g. benzoylaminosulfonyl), an alkyl sulfonylamino carbonyl group (e.g. methylsulfonylaminocarbonyl) and an arylsulfonylaminocarbonyl group (e.g. p-methylphenylsulfonylaminocarbonyl).

Suitable fullerene derivatives include those represented by the following formula (1).

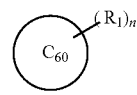

Formula (1)

In the formula (1), $R_1$ represents a substituent. As to the substituent, the W described above is usable. And the substituent is preferably an alkyl group, an aryl group or a heterocyclic group. The preferred groups and suitable examples thereof include the same ones as recited in the W description. Specifically, the preferable alkyl group is an alkyl group having 1 to 12 carbon atoms, and the ring from which the aryl group or the heterocyclic group is derived is preferably a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a benzimidazole ring, an imidazopyridine ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring or a phenazine ring, more preferably a benzene ring, a naphthalene ring, an anthracene ring, a phenanthrene ring, a pyridine ring, an imidazole ring, an oxazole ring or a thiazole ring, and particularly preferably a benzene ring, a naphthalene ring or a pyridine ring. These rings may further have substituents, and these substituents may combine with each other to form a ring or rings where possible. Additionally, when n is 2 or more, each $R_1$ may be the same as or different from every other $R_1$. And two or more $R_1$s may combine to form a ring or rings where possible.

The letter n represents an integer of 1 to 60, preferably an integer of 1 to 10.

Examples of a suitably used fullerene derivative include the compounds illustrated below, but fullerene derivatives usable in the invention should not be construed as being limited to these compounds.

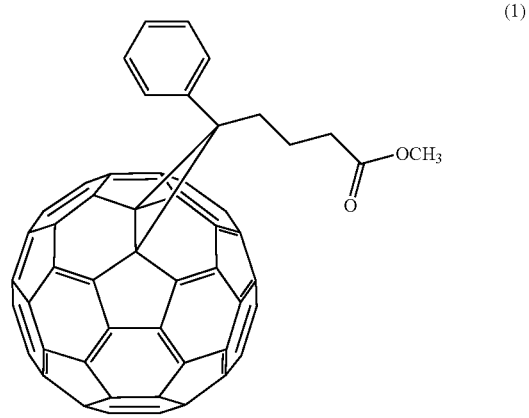

(1)

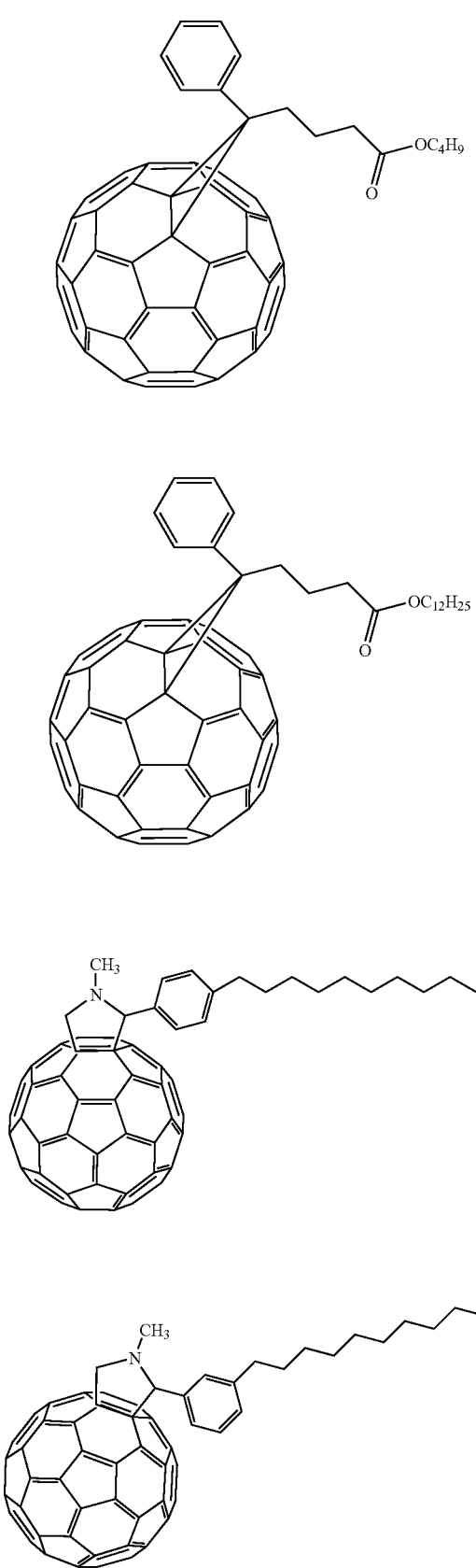
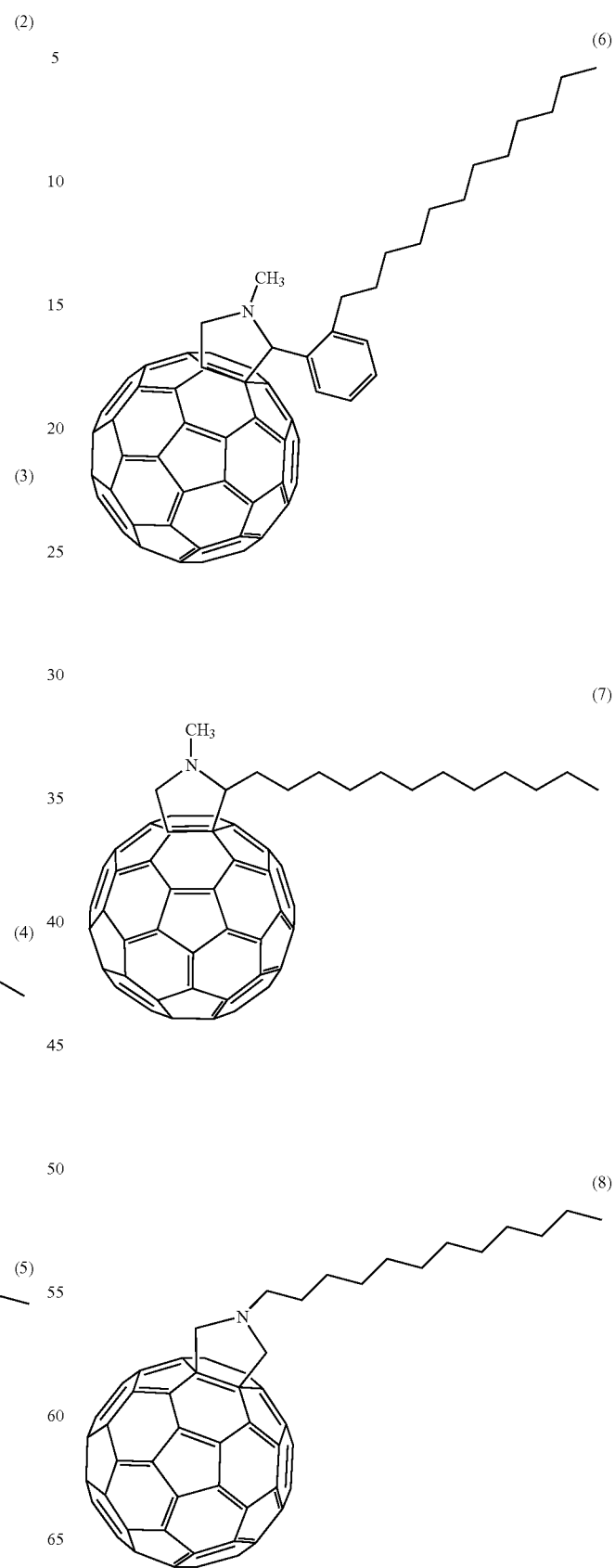

-continued (9)

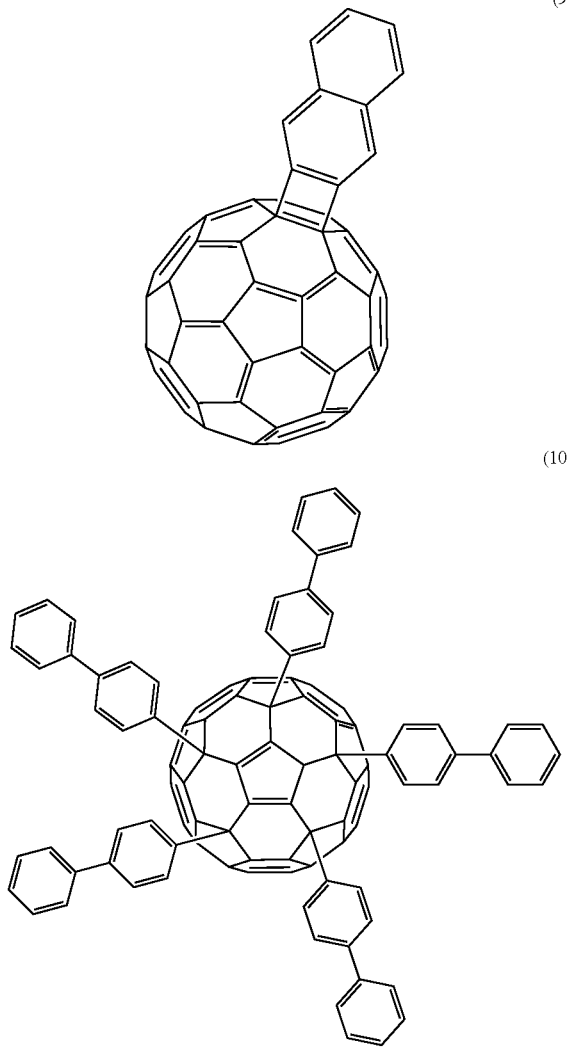

(10)

The compounds described e.g. in *Kikan Kagaku Sosetsu (Quarterly Review of Chemistry)*, No. 43 (1999), edited by The Chemical Society of Japan, JP-A-10-167994, JP-A-11-255508, JP-A-11-255509, JP-A-2002-241323 and JP-A-2003-196881 can also be used as fullerenes and fullerene derivatives. The fullerenes and the fullerene derivatives used in the invention can be produced by use of or in conformity with the methods described e.g. in *Kikan Kagaku Sosetsu (Quarterly Review of Chemistry)*, No. 43 (1999), edited by The Chemical Society of Japan, JP-A-10-167994, JP-A-11-255508, JP-A-11-255509, JP-A-2002-241323 and JP-A-2003-196881.

Figure 2:
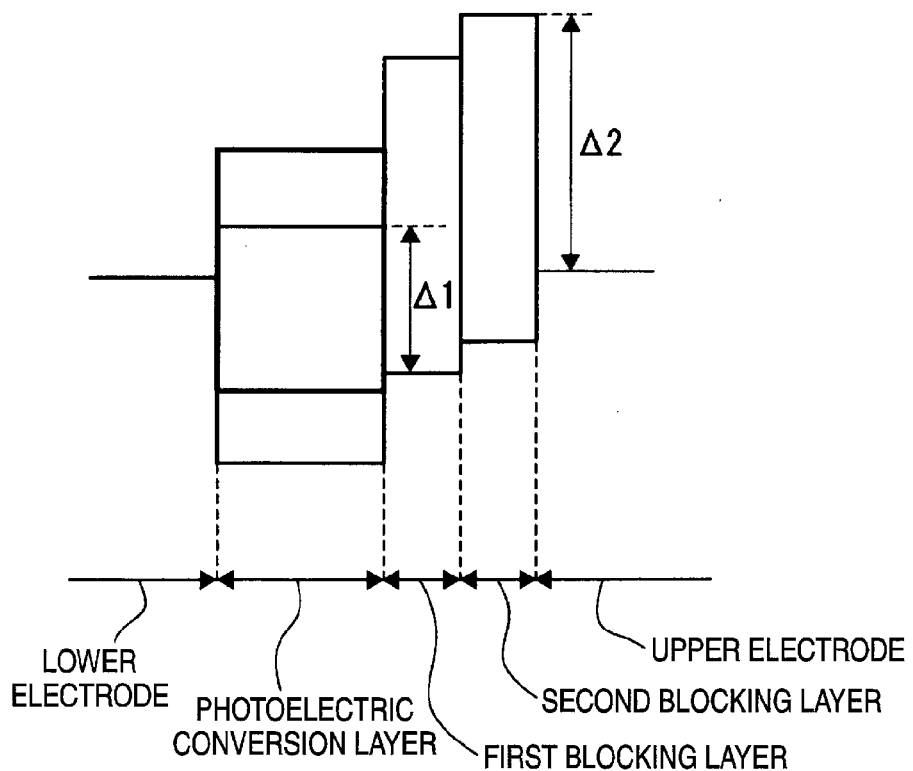
FIG. 2 is an energy diagram of the photoelectric conversion device shown in FIG. 1.

FIG. 2 is an energy diagram of the photoelectric conversion device shown in FIG. 1. In FIG. 2, energy heights of a lower electrode 11, a photoelectric conversion layer 12, a first blocking layer 16, a second blocking layer 18 and an upper electrode 14 are shown in sequence, from the left side to the right side.

Herein, a difference between the ionization potential Ip of the first blocking layer 16 adjacent to the photoelectric conversion layer 12 and the electron affinity Ea of an n-type organic semiconductor contained in the photoelectric conversion layer 12 is taken as Δ1. In addition, a difference between the electron affinity Ea of the second blocking layer 18 and the work function of the upper electrode 14 adjacent to the second blocking layer 18 is taken as Δ2.

The photoelectric conversion device shown in FIG. 1 and FIG. 2 can inhibit an increase in dark current by being configured to satisfy the following conditions (a) and (b).
(a) A difference Δ1 between the ionization potential Ip of the first blocking layer 16 adjacent to the photoelectric conversion layer 12 and the electron affinity Ea of an n-type organic semiconductor in the photoelectric conversion layer 12 is at least 1 eV.
(b) A gross thickness of a charge blocking layer 15 including the first blocking layer 16 and the second blocking layer 18 is at least 20 nm.

Figure 3:
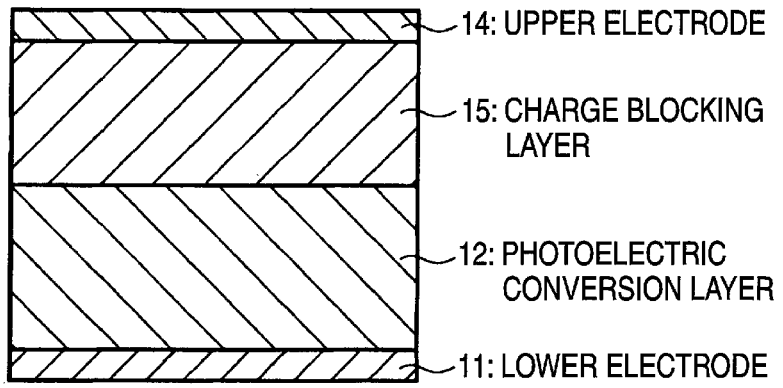
FIG. 3 is a cross-sectional view showing another layer structure of the photoelectric conversion device.
Figure 4:
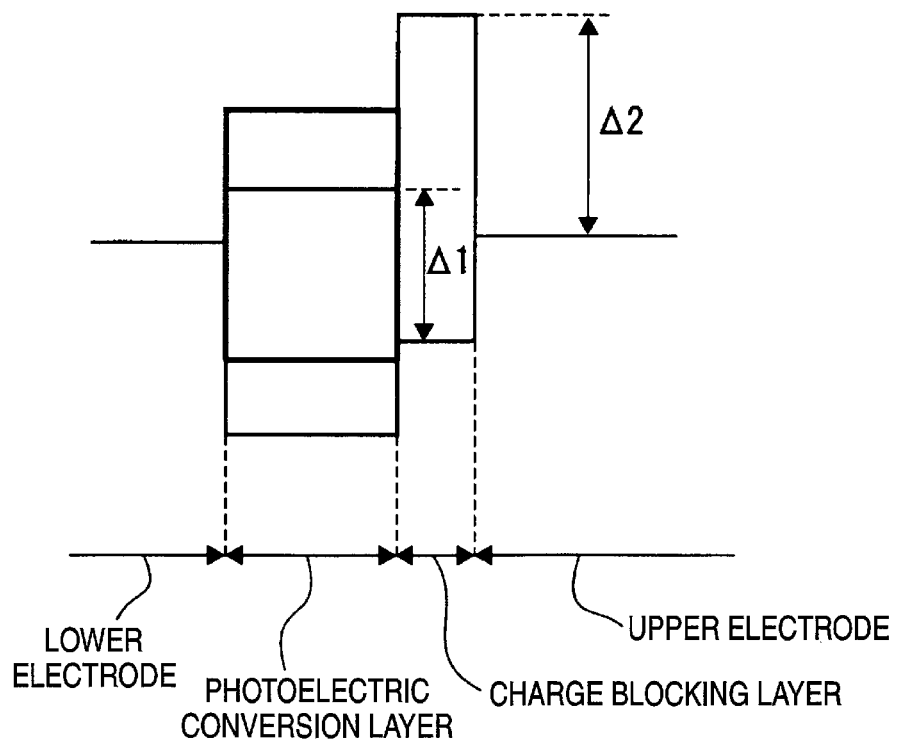
FIG. 4 is an energy diagram of the photoelectric conversion device shown in FIG. 3.

FIG. 3 is a cross-sectional view showing another layer structure of the photoelectric conversion device. FIG. 4 is an energy diagram of the photoelectric conversion device shown in FIG. 3. In the photoelectric conversion device shown in FIG. 3, the charge blocking layer has a single-layer structure.

As to the photoelectric conversion device having a single-layer charge blocking layer, a difference between the ionization potential Ip of the charge blocking layer 15 adjacent to the photoelectric conversion layer 12 and the electron affinity Ea of an n-type organic semiconductor contained in the photoelectric conversion layer 12 is taken as Δ1. In addition, a difference between the electron affinity Ea of the charge blocking layer 15 and the work function of the upper electrode 14 adjacent to the charge blocking layer 15 is taken as Δ2.

The photoelectric conversion device shown in FIG. 3 and FIG. 4 can inhibit an increase in dark current by being configured to satisfy the following conditions (a) and (b).
(a) A difference Δ1 between the ionization potential Ip of the charge blocking layer 15 adjacent to the photoelectric conversion layer 12 and the electron affinity Ea of an n-type organic semiconductor is at least 1 eV.
(b) A gross thickness of the single-layer charge blocking layer 15 is at least 20 nm That is to say, according to the photoelectric conversion device's structures shown in FIG. 1 and FIG. 3, an increase in dark current can be inhibited by equipping a photoelectric conversion device with a charge blocking layer 15 of single- or multiple-layer structure, and that by configuring the device so that:
(a) a difference (Δ1) between the ionization potential Ip of the charge blocking layer 15 (or the layer adjacent to the photoelectric conversion layer 12 when the charge blocking layer 15 has a multiple-layer structure) and the electron affinity Ea of an n-type organic semiconductor is at least 1 eV, and
(b) a gross thickness of the charge blocking layer 15 is at least 20 nm. When the charge blocking layer 15 has a multiple-layer structure, the gross thickness of the charge blocking layer 15 represents the total thickness of layers including the multiple-layers.

In the photoelectric conversion devices shown in FIG. 1 and FIG. 3, it is appropriate that Δ2 be adjusted to at least 1.3 eV.

Next an example of the structure of an imaging device equipped with a photoelectric conversion device is illustrated.

Figure 5:
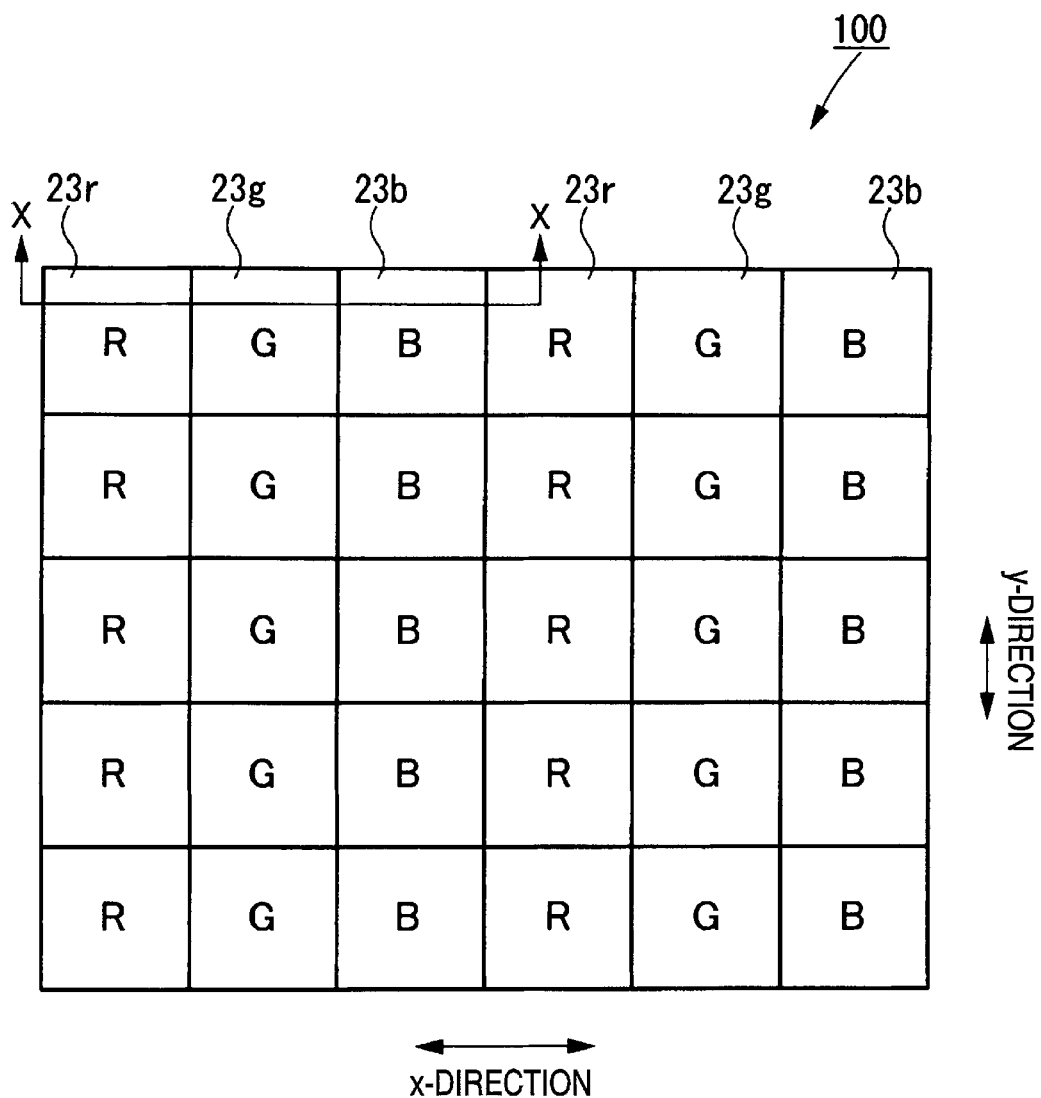
FIG. 5 is a diagram schematically showing a portion of the surface of an imaging device.
Figure 6:
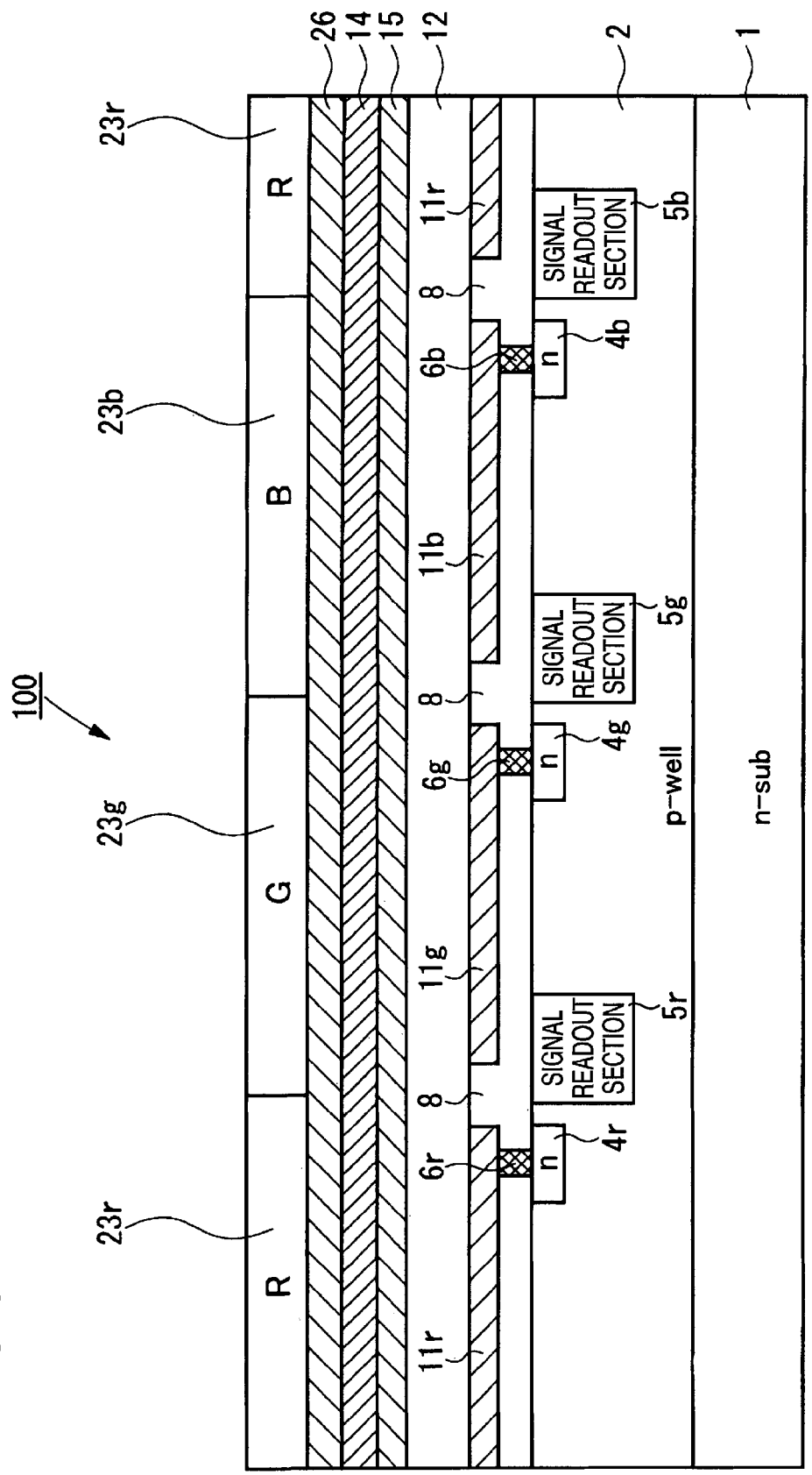
FIG. 6 is a diagram illustrating schematically the cross section formed by cutting at the X-X line of the imaging device shown in FIG. 5.

FIG. 5 is a diagram schematically showing a portion of the surface of an imaging device 100. FIG. 6 is a diagram illustrating schematically the cross section formed by cutting at the X-X line of the imaging device 100 shown in FIG. 5.

In the imaging device 100, p-well layer 2 is formed on an n-type silicon substrate 1. In the following description, a combination of the n-type silicon substrate 1 and the p-well layer 2 is referred to as a semiconductor substrate (a substrate). In an x-direction and a y-direction orthogonal thereto, respectively, on one and the same plane over the semiconductor substrate, combinations of color filters of three types, namely a color filter 23r through which R light (red light) passes, a color filter 23g through which G light (green light) passes and a color filter 23b through which B light (blue light) passes, are arrayed in large numbers.

The color filter 23r, 23g and 23b can be made using heretofore known materials.

As the array of color filters 23r, 23g and 23b, the heretofore known color filter arrays used in heretofore known solid-state imaging devices of the single-plate type (e.g. Bayer array, longitudinal stripes, transverse stripes) can be adopted.

Pixel electrodes 11r, 11g and 11b, which are made from TiN or so on, are formed over the n-type silicon substrate 1. The pixel electrodes 11r, 11g and 11b correspond to the lower electrode 11 or upper electrode 14 of the photoelectric conversion device shown in FIG. 1 or FIG. 3, and they are electrodes divided in response to the colors of the color filters 23r, 23g and 23b, respectively.

On each of the pixel electrodes 11r, 11g and 11b, a charge blocking layer 15 of single-sheet structure and a photoelectric conversion layer 12 of single-sheet structure are formed for common use among the color filters 23r, 23g and 23b.

On the charge blocking layer 15, an upper electrode 14 of single-sheet structure is formed for common use among the color filters 23r, 23g and 23b. Protective layer 26 is formed below the color filters 23r, 23g and 23b.

A photoelectric conversion device responding to a color filter 23r is formed with a pixel electrode 11r, the upper electrode 14 facing thereto and a portion of the photoelectric conversion element 12 sandwiched between them. In the following description, such a photoelectric conversion device is referred to as a photoelectric conversion device on an R substrate.

A photoelectric conversion device responding to a color filter 23g is formed with a pixel electrode 11g, the upper electrode 14 facing thereto and a portion of the photoelectric conversion element 12 sandwiched between them. In the following description, such a photoelectric conversion device is referred to as a photoelectric conversion device on a G substrate.

A photoelectric conversion device responding to a color filter 23b is formed with a pixel electrode 11b, the upper electrode 14 facing thereto and a portion of the photoelectric conversion element 12 sandwiched between them. In the following description, such a photoelectric conversion device is referred to as a photoelectric conversion device on a B substrate.

In the p-well layer 2, high-density n-type impurity regions (hereinafter referred to as n+ regions) 4r for accumulation of charges developing in portions of the photoelectric conversion layer 12 which are included in photoelectric conversion devices on R substrates are formed. Additionally, for the purpose of preventing light from going into each n+ region 4r, it is appropriate that shading film be formed on each n+ region 4r.

In the p-well layer 2, n+ regions 4g for accumulation of charges developing in portions of the photoelectric conversion layer 12 which are included in photoelectric conversion devices on G substrates are further formed. Additionally, for the purpose of preventing light from going into each n+ region 4g, it is appropriate that shading film be formed on each n+ region 4g.

In the p-well layer 2, n+ regions 4b for accumulation of charges developing in portions of the photoelectric conversion layer 12 included in photoelectric conversion devices on B substrates are formed, too. Additionally, for the purpose of preventing light from going into each n+ region 4b, it is appropriate that shading film be formed on each n+ region 4b.

On each n+ region 4r, a contact section 6r made from a metal such as aluminum is formed and, on the contact section 6r, a pixel electrode 11r is formed. The n+ region 4r and the pixel electrode 11r electrically connect by the contact section 6r. The contact section 6r is embedded in an insulating layer 8. The pixel electrode 11r is embedded in the insulating layer 8 so that the surface of the pixel electrode 11r coincides with the surface of the insulating layer 8.

On each n+ region 4g, a contact section 6g made from a metal such as aluminum is formed and, on the contact section 6g, a pixel electrode 11g is formed. The n+ region 4g and the pixel electrode 11g electrically connect by the contact section 6g. The contact section 6g is embedded in an insulating layer 8. The pixel electrode 11g is embedded in the insulating layer 8 so that the surface of the pixel electrode 11g coincides with the surface of the insulating layer 8.

On each n+ region 4b, a contact section 6b made from a metal such as aluminum is formed and, on the contact section 6b, a pixel electrode 11b is formed. The n+ region 4b and the pixel electrode 11b electrically connect by the contact section 6b. The contact section 6b is embedded in an insulating layer 8. The pixel electrode 11b is embedded in the insulating layer 8 so that the surface of the pixel electrode 11b coincides with the surface of the insulating layer 8.

In other regions inside the p-well layer 2, where the n+ regions 4r, 4g and 4b are not formed, signal readout sections 5r for reading signals responsive to charges accumulated in n+ regions 4r, respectively, signal readout sections 5g for reading signals responsive to charges accumulated in n+ regions 4g, respectively, and signal readout sections 5b for reading signals responsive to charges accumulated in n+ regions 4b, respectively, are formed. As each of the signal readout sections 5r, 5g and 5b, heretofore known structures using CCD or MOS circuitry can be adopted. Additionally, provision of shaded film on the signal readout regions 5r, 5g and 5b is adequate for preventing light from going into the signal readout sections 5r, 5g and 5b.

Then, photoelectric conversion devices presented in the following examples and comparative examples are examined for inhibition of an increase in dark current.

Additionally, the compounds used for the following examinations are shown below. As a fullerene, the same one as exemplified above is used.

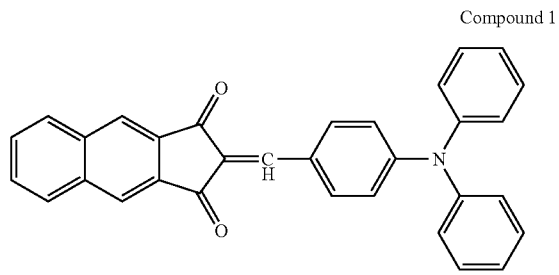

Compound 1

-continued

Compound 2

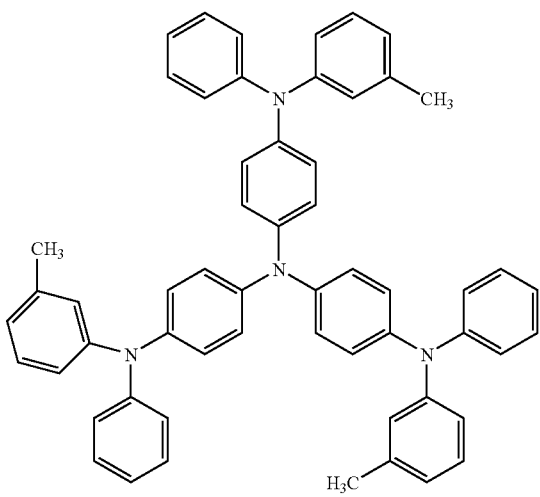

Compound 3

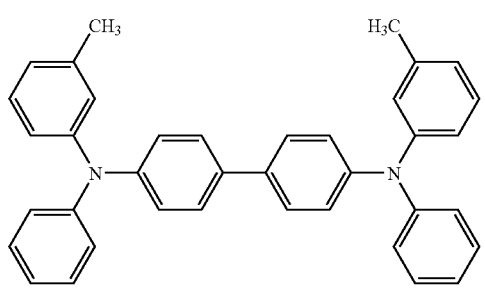

Compound 4

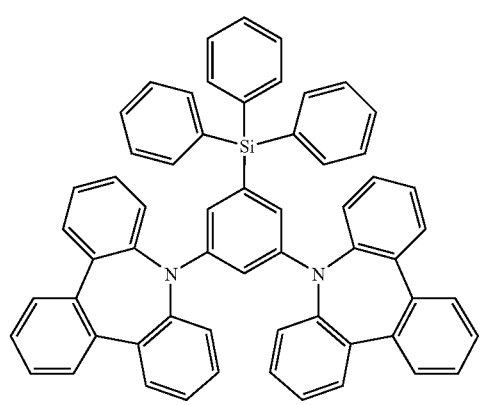

Compound 5

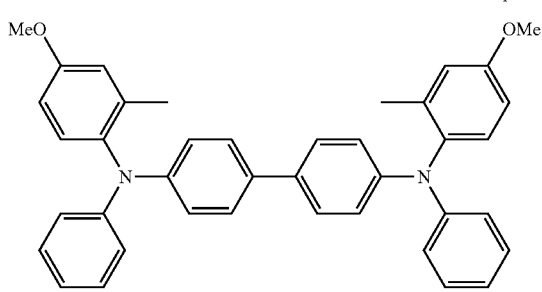

-continued

Compound 6

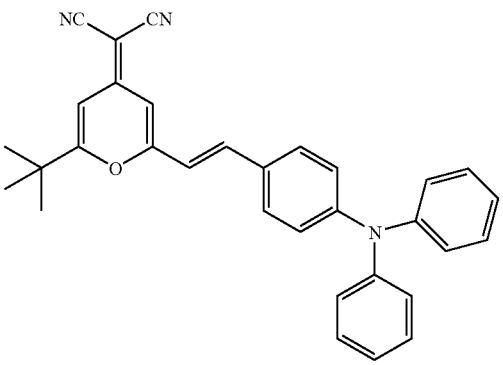

Compound 7

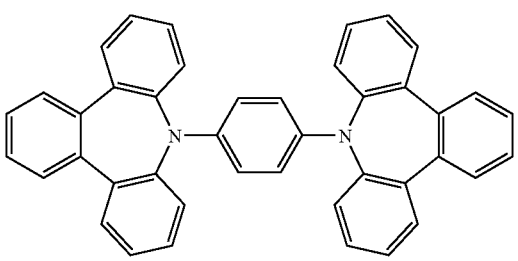

Ip and Ea values of the fullerene and the compounds used in the following examinations are listed below in Table 1. The Ip values of the organic materials were measured with a SURFACE ANALYZER Model AC-2 made by Riken Keiki Co., Ltd. On the quartz substrate, each organic material was deposited to have a thickness of about 100 nm, and Ip measurement of the deposited organic material was made under a light amount of 20 nW to 50 nW. In addition, the electron affinity Ea of each organic material was evaluated by measuring an absorption spectrum of the deposited organic material, determining energy of its absorption end, and then subtracting the energy at the absorption end from the Ip value.

TABLE 1

| | Ip (eV) | Ea (eV) |
|---|---|---|
| Fullerene | 6.0 | 4.2 |
| Compound 1 | 5.5 | 3.4 |
| Compound 2 | 5.1 | 1.9 |
| Compound 3 | 5.5 | 2.3 |
| Compound 4 | 5.6 | 2.2 |
| Compound 5 | 5.2 | 2.1 |
| Compound 6 | 5.5 | 3.3 |
| Compound 7 | 4.9 | 1.9 |

Examples 1 to 6, 10 and 11, and Comparative Example 4 are photoelectric conversion devices each of which has the same structure as shown in FIG. 1, wherein a lower electrode, a photoelectric conversion layer, a first blocking layer, a second blocking layer and an upper electrode are included.

Examples 7 to 9, and Comparative Examples 1 to 3 are photoelectric conversion devices each of which has the same structure as shown in FIG. 3, wherein a lower electrode, a photoelectric conversion layer, a single-layer charge blocking layer and an upper electrode are included.

In every Example and in every Comparative Example, ITO was used in the lower electrode, while the upper electrode was formed by using high-frequency magnetron sputtering apparatus and depositing an ITO layer having a thickness of 5 to 20 nm.

In Example 1, an element of Compound 1-fullerene mixture (Compound 1: fullerene=1:3 (by mass)) with 400 nm-thickness deposited by co-evaporation in vacuo was used as the photoelectric conversion layer.

And the first blocking layer was formed by using a vacuum evaporation technique and evaporating the organic compound defined as Compound 1 to have a thickness of 10 nm.

The second blocking layer was formed by using a vacuum evaporation technique and evaporating the organic compound defined as Compound 2 to have a thickness of 300 nm.

In Example 2, an element of Compound 1-fullerene mixture (Compound 1: fullerene=1:3 (by mass)) with 400 nm-thickness formed by co-evaporation in vacuo was used as the photoelectric conversion layer.

And the first blocking layer was formed by using a vacuum evaporation technique and evaporating the organic compound defined as Compound 3 to have a thickness of 10 nm.

The second blocking layer was formed by using a vacuum evaporation technique and evaporating the organic compound defined as Compound 2 to have a thickness of 300 nm.

In Example 3, an element of Compound 1-fullerene mixture (Compound 1: fullerene=1:3 (by mass)) with 400 nm-thickness formed by co-evaporation in vacuo was used as the photoelectric conversion layer.

And the first blocking layer was formed by using a vacuum evaporation technique and evaporating the organic compound defined as Compound 4 to have a thickness of 10 nm.

The second blocking layer was formed by using a vacuum evaporation technique and evaporating the organic compound defined as Compound 2 to have a thickness of 300 nm.

In Example 4, an element of Compound 1-fullerene mixture (Compound 1: fullerene=1:3 (by mass)) with 400 nm-thickness formed by co-evaporation in vacuo was used as the photoelectric conversion layer. And the first blocking layer was formed by using a vacuum evaporation technique and evaporating the organic compound defined as Compound 5 to have a thickness of 10 nm.

The second blocking layer was formed by using a vacuum evaporation technique and evaporating the organic compound defined as Compound 2 to have a thickness of 300 nm.

In Example 5, an element of Compound 6-fullerene mixture (Compound 6: fullerene=1:3 (by mass)) with 400 nm-thickness formed by co-evaporation in vacuo was used as the photoelectric conversion layer.

And the first blocking layer was formed by using a vacuum evaporation technique and evaporating the organic compound defined as Compound 6 to have a thickness of 10 nm.

The second blocking layer was formed by using a vacuum evaporation technique and evaporating the organic compound defined as Compound 2 to have a thickness of 300 nm.

In Example 6, an element of Compound 6-fullerene mixture (Compound 6: fullerene=1:3 (by mass)) with 400 nm-thickness formed by co-evaporation in vacuo was used as the photoelectric conversion layer.

And the first blocking layer was formed by using a vacuum evaporation technique and evaporating the organic compound defined as Compound 3 to have a thickness of 10 nm.

The second blocking layer was formed by using a vacuum evaporation technique and evaporating the organic compound defined as Compound 2 to have a thickness of 300 nm.

In Example 7, an element of Compound 1-fullerene mixture (Compound 1: fullerene=1:3 (by mass)) with 400 nm-thickness formed by co-evaporation in vacuo was used as the photoelectric conversion layer.

And the single-layer charge blocking layer was formed by using a vacuum evaporation technique and evaporating the organic compound defined as Compound 3 to have a thickness of 300 nm.

In Example 8, an element of Compound 6-fullerene mixture (Compound 6: fullerene=1:3 (by mass)) with 400 nm-thickness formed by co-evaporation in vacuo was used as the photoelectric conversion layer.

And the single-layer charge blocking layer was formed by using a vacuum evaporation technique and evaporating the organic compound defined as Compound 3 to have a thickness of 300 nm.

In Example 9, an element of Compound 1-fullerene mixture (Compound 1: fullerene=1:3 (by mass)) with 400 nm-thickness formed by co-evaporation in vacuo was used as the photoelectric conversion layer.

And the single-layer charge blocking layer was formed by using a vacuum evaporation technique and evaporating the organic compound defined as Compound 3 to have a thickness of 20 nm.

In Example 10, an element of Compound 1-fullerene mixture (Compound 1: fullerene=1:3 (by mass)) with 400 nm-thickness formed by co-evaporation in vacuo was used as the photoelectric conversion layer.

And the first blocking layer was formed by using a vacuum evaporation technique and evaporating the organic compound defined as Compound 1 to have a thickness of 25 nm.

The second blocking layer was formed by using a vacuum evaporation technique and evaporating the organic compound defined as Compound 2 to have a thickness of 300 nm.

In Example 11, an element of Compound 1-fullerene mixture (Compound 1: fullerene=1:3 (by mass)) with 400 nm-thickness formed by co-evaporation in vacuo was used as the photoelectric conversion layer.

And the first blocking layer was formed by using a vacuum evaporation technique and evaporating the organic compound defined as Compound 1 to have a thickness of 5 nm The second blocking layer was formed by using a vacuum evaporation technique and evaporating the organic compound defined as Compound 2 to have a thickness of 300 nm.

In Comparative Example 1, an element of Compound 1-fullerene mixture (Compound 1: fullerene=1:3 (by mass)) with 400 nm-thickness formed by co-evaporation in vacuo was used as the photoelectric conversion layer.

And the single-layer charge blocking layer was formed by using a vacuum evaporation technique and evaporating the organic compound defined as Compound 2 to have a thickness of 300 nm.

In Comparative Example 2, an element of Compound 6-fullerene mixture (Compound 6: fullerene=1:3 (by mass)) with 400 nm-thickness formed by co-evaporation in vacuo was used as the photoelectric conversion layer.

And the single-layer charge blocking layer was formed by using a vacuum evaporation technique and evaporating the organic compound defined as Compound 2 to have a thickness of 300 nm.

In Comparative Example 3, an element of Compound 1-fullerene mixture (Compound 1: fullerene=1:3 (by mass)) with 400 nm-thickness formed by co-evaporation in vacuo was used as the photoelectric conversion layer.

And the single-layer charge blocking layer was formed by using a vacuum evaporation technique and evaporating the organic compound defined as Compound 3 to have a thickness of 10 nm.

In Comparative Example 4, an element of Compound 1-fullerene mixture (Compound 1: fullerene=1:3 (by mass))

with 400 nm-thickness formed by co-evaporation in vacuo was used as the photoelectric conversion layer.

And the first blocking layer was formed by using a vacuum evaporation technique and evaporating the organic compound defined as Compound 7 to have a thickness of 10 nm The second blocking layer was formed by using a vacuum evaporation technique and evaporating the organic compound defined as Compound 2 to have a thickness of 300 nm.

In each of Examples 1 to 6, 10 and 11, and Comparative Example 4, a difference between the ionization potential Ip of the first blocking layer and the electron affinity Ea of fullerene was taken as Δ1; while, in each of Examples 7 to 9 and Comparative Examples 1 to 3, a difference between the ionization potential Ip of the charge blocking layer and the electron affinity Ea of fullerene was taken as Δ1.

In each of Examples 1 to 11, the Δ1 defined as above was found to be 1.0 eV or above, and the gross thickness of the charge blocking layer, irrespective of whether it had a single- or multiple-layer structure, was 20 nm or greater.

Each of the thus made photoelectric conversion devices, without exposure to air, was transported into a glove box whose moisture content and oxygen concentration were each kept at 1 ppm or below, and sealed in a hygroscopic material-lined glass container by use of a UV cure resin as a sealant.

Dark current (unit: $A/cm^2$) measurements and external quantum efficiency (or incident photon-to-current conversion efficiency (IPCE)) measurements at a wavelength of 530 nm were made on those devices under the condition that a bias of 2.0 E+5 V/cm was applied to the lower electrode side of each device. Measurement results obtained are shown in Table 2.

In Comparative Example 4, carriers were generated at the interface, because the difference between the Ip of Compound 7 and the Ea of fullerene was smaller than 1 eV, to result in generation of a large dark current.

Further, the charge blocking layers of Examples 1 to 6 and 10 have multiple layers. Out of the multiple layers, the first blocking layer which is adjacent to the photoelectric conversion layer has a thickness of 10 nm or more. By controlling the thickness of the first blocking layer to be within the above range, the dark current can be further suppressed.

An issue of carriers is inhibited in accordance with the invention, and thereby the invention can provide a photoelectric conversion device and an imaging device which each ensure reduction in dark current.

The entire disclosure of each and every foreign patent application from which the benefit of foreign priority has been claimed in the present application is incorporated herein by reference, as if fully set forth.

What is claimed is:

1. A photoelectric conversion device, comprising:
   a pair of electrodes;
   a photoelectric conversion layer that is arranged between the pair of electrodes and that contains an n-type organic semiconductor comprising a fullerene or a fullerene derivative and further contains a p-type organic semiconductor; and
   an electron blocking layer that is arranged between at least one of the pair of electrodes and the photoelectric conversion layer, the electron blocking layer being formed of a single layer or two or more layers,

TABLE 2

| | Photoelectric conversion layer | First blocking layer (thickness (nm)) | Second blocking layer/Charge blocking layer (thickness (nm)) | Dark current ($A/cm^2$) | External quantum efficiency (%) | Δ1 (eV) |
|---|---|---|---|---|---|---|
| Example 1 | Compound 1 $C_{60}$ | Compound 1 (10) | Compound 2 (300) | 9.1E−11 | 68 | 1.3 |
| Example 2 | Compound 1 $C_{60}$ | Compound 3 (10) | Compound 2 (300) | 1.1E−10 | 72 | 1.3 |
| Example 3 | Compound 1 $C_{60}$ | Compound 4 (10) | Compound 2 (300) | 2.2E−10 | 70 | 1.4 |
| Example 4 | Compound 1 $C_{60}$ | Compound 5 (10) | Compound 2 (300) | 2.8E−10 | 69 | 1.0 |
| Example 5 | Compound 6 $C_{60}$ | Compound 6 (10) | Compound 2 (300) | 1.4E−10 | 66 | 1.3 |
| Example 6 | Compound 6 $C_{60}$ | Compound 3 (10) | Compound 2 (300) | 2.4E−10 | 69 | 1.3 |
| Example 7 | Compound 1 $C_{60}$ | absent | Compound 3 (300) | 8.5E−10 | 71 | 1.3 |
| Example 8 | Compound 6 $C_{60}$ | absent | Compound 3 (300) | 9.1E−10 | 69 | 1.3 |
| Example 9 | Compound 1 $C_{60}$ | absent | Compound 3 (20) | 9.2E−10 | 71 | 1.3 |
| Example 10 | Compound 1 $C_{60}$ | Compound 1 (25) | Compound 2 (300) | 1.1E−10 | 42 | 1.3 |
| Example 11 | Compound 1 $C_{60}$ | Compound 1 (5) | Compound 2 (300) | 6.2E−09 | 69 | 1.3 |
| Comparative Example 1 | Compound 1 $C_{60}$ | absent | Compound 2 (300) | 1.3E−08 | 72 | 0.9 |
| Comparative Example 2 | Compound 6 $C_{60}$ | absent | Compound 2 (300) | 2.1E−08 | 70 | 0.9 |
| Comparative Example 3 | Compound 1 $C_{60}$ | absent | Compound 3 (10) | 8.2E−06 | | 1.3 |
| Comparative Example 4 | Compound 1 $C_{60}$ | Compound 7 (10) | Compound 2 (300) | 9.8E−09 | 68 | 0.7 |

As can be seen from the examination results, low dark current was achieved in each of Examples 1 to 11, and besides, high external quantum efficiency was achieved in each of Examples 1 to 9 and 11.

In Comparative Examples 1 and 2 each, carriers were produced at the interface, because the difference between the Ip of Compound 2 and the Ea of fullerene was smaller than 1 eV, to result in generation of a large dark current.

In Comparative Example 3, injection of carriers from the electrode occurred, because the thickness of the charge blocking layer was thin although the difference between the Ip of the Compound 3 and the Ea of fullerene was greater than 1 eV, to result in generation of a large dark current.

wherein
(a) a difference Δ1 between ionization potential Ip of a layer of the electron blocking layer adjacent to the photoelectric conversion layer and electron affinity Ea of a layer of the n-type organic semiconductor is at least 1 eV;
(b) the electron blocking layer has a gross thickness of at least 20 nm;
(c) a negative external voltage is applied to one of the electrodes which is closer to the electron blocking layer, or a positive external voltage is applied to the other electrode; and
the ionization potential Ip is determined by forming a thin layer of a material of the electron blocking layer and measuring an ionization potential Ip of the thin layer by a Photo-Electron Spectroscopy in Air, and the electron affinity Ea is determined by forming a thin layer of the n-type organic semiconductor, measuring an absorption spectrum of the thin layer, determining energy of an absorption end of the absorption spectrum and subtracting the energy at the absorption end from a value of an ionization potential Ip of the n-type organic semiconductor, wherein the ionization potential Ip of the n-type organic semiconductor is determined by forming a thin layer of the n-type organic semiconductor and measuring an ionization potential Ip of the thin layer by a Photo-Electron Spectroscopy in Air.

2. The photoelectric conversion device according to claim 1,
wherein the electron blocking layer includes two or more layers, and
a layer of the electron blocking layer adjacent to the photoelectric conversion layer out of the two or more layers has a thickness of at least 10 nm.

3. The photoelectric conversion device according to claim 1,
wherein the electron blocking layer includes two or more layers, and
a difference between electron affinity Ea of a layer of the electron blocking layer adjacent to one of the pair of electrodes out of the two or more layers and a work function of the adjacent one of the pair of electrodes is at least 1.3 eV.

4. The photoelectric conversion device according to claim 1,
wherein the electron blocking layer includes two or more layers, and
a layer of the electron blocking layer adjacent to the photoelectric conversion layer out of the two or more layers includes the same material as the p-type organic semiconductor contained in the photoelectric conversion layer.

5. The photoelectric conversion device according to claim 1,
wherein the electron blocking layer has at least one layer containing an inorganic material.

6. An imaging device, comprising:
the photoelectric conversion device according to claim 1;
a substrate over which the photoelectric conversion device is formed; and
a signal readout section that reads of charges generated by the photoelectric conversion device.

* * * * *